United States Patent
Shin

(10) Patent No.: US 10,852,768 B2
(45) Date of Patent: Dec. 1, 2020

(54) DISPLAY DEVICE

(71) Applicant: Samsung Display Co., Ltd., Yongin-si (KR)

(72) Inventor: Eunju Shin, Busan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/552,144

(22) Filed: Aug. 27, 2019

(65) Prior Publication Data

US 2020/0169623 A1 May 28, 2020

(30) Foreign Application Priority Data

Nov. 22, 2018 (KR) .................. 10-2018-0145389

(51) Int. Cl.
| | | |
|---|---|---|
| G06F 1/16 | (2006.01) | |
| H04M 1/02 | (2006.01) | |
| H01L 51/00 | (2006.01) | |
| G02F 1/1333 | (2006.01) | |
| H05K 5/00 | (2006.01) | |
| H01L 51/52 | (2006.01) | |

(52) U.S. Cl.
CPC ...... *G06F 1/1637* (2013.01); *G02F 1/133308* (2013.01); *H01L 51/0097* (2013.01); *H01L 51/529* (2013.01); *H04M 1/0266* (2013.01); *H05K 5/0017* (2013.01); *H05K 5/0021* (2013.01); *G02F 2001/133322* (2013.01); *G02F 2201/503* (2013.01)

(58) Field of Classification Search
CPC ... G02F 1/133308; G02F 2001/133322; G02F 2201/503; H05K 5/0017; H05K 5/0021; G06F 1/1637; H01L 51/529
See application file for complete search history.

(56) References Cited

U.S. PATENT DOCUMENTS

| | | | |
|---|---|---|---|
| 8,692,461 B2 * | 4/2014 | Ha ................. | H01L 51/5237 313/512 |
| 8,780,579 B2 * | 7/2014 | Kwon .............. | H01L 51/5237 361/784 |
| 9,699,943 B2 * | 7/2017 | Bae ................. | H05K 1/028 |
| 9,769,919 B2 * | 9/2017 | Park ................ | H01L 27/32 |
| 10,229,961 B2 * | 3/2019 | Choi ............... | H01L 51/5284 |
| 10,437,284 B2 * | 10/2019 | Kwak .............. | H04M 1/0266 |
| 2017/0006738 A1 * | 1/2017 | Lee ................. | G02F 1/13452 |
| 2018/0019293 A1 | 1/2018 | Choi et al. | |
| 2018/0203483 A1 | 7/2018 | Kwak et al. | |
| 2019/0213925 A1 * | 7/2019 | Ha ................. | G06F 3/03547 |

FOREIGN PATENT DOCUMENTS

KR 10-2018-0085627 A 7/2018

* cited by examiner

*Primary Examiner* — Nidhi Thaker
(74) *Attorney, Agent, or Firm* — Lewis Roca Rothgerber Christie LLP

(57) ABSTRACT

A display device includes a display panel, a cushion layer below the display panel, a heat-dissipation sheet below the cushion layer, and a flexible circuit substrate electrically connected to the display panel and bent toward a rear surface of the display panel. The display panel includes a first region that overlaps the flexible circuit substrate and a second region that overlap the cushion layer in a direction perpendicular to the rear surface. The cushion layer and the heat-dissipation sheet only overlap the second region in a direction perpendicular to the rear surface.

19 Claims, 7 Drawing Sheets

DISPLAY DEVICE

CROSS-REFERENCE TO RELATED APPLICATIONS

This application claims priority to and the benefit of Korean Patent Application No. 10-2018-0145389, filed on Nov. 22, 2018, in the Korean Intellectual Property Office, the entire content of which is hereby incorporated by reference.

BACKGROUND

The present disclosure relates to a display device with a reduced thickness.

A display device includes a display panel, a flexible circuit substrate, and a frame. The flexible circuit substrate is electrically connected to the display panel and is bent toward a rear surface of the display panel. A driving device in the flexible circuit substrate is located in an opening or container region, which is defined in the frame. In the case where the opening or the container region is formed, a thickness of the frame may be decreased, and this may lead to deterioration or reduction in durability of the display device.

SUMMARY

An embodiment of the inventive concept provides a display device with a reduced thickness.

According to an embodiment of the inventive concept, a display device may include a display panel, a cushion layer below the display panel, a heat-dissipation sheet below the cushion layer, and a flexible circuit substrate electrically connected to the display panel and bent toward a rear surface of the display panel. The display panel may include a first region that overlaps the flexible circuit substrate and a second region that overlaps the cushion layer in a direction perpendicular to the rear surface. The cushion layer and the heat-dissipation sheet may only overlap the second region in a direction perpendicular to the rear surface.

In an embodiment, the display device may further include an embossing layer between the display panel and the cushion layer. The embossing layer may overlap the first region and the second region in a direction perpendicular to the rear surface.

In an embodiment, the embossing layer may have two opposite surfaces, each of the opposite surfaces having an adhesive property.

In an embodiment, the flexible circuit substrate and the cushion layer may be attached to a bottom surface of the embossing layer.

In an embodiment, the display device may further include an electromagnetic shield between the embossing layer and the flexible circuit substrate.

In an embodiment, a side surface of the electromagnetic shield may face a side surface of the cushion layer.

In an embodiment, the flexible circuit substrate and the electromagnetic shield may be attached to a bottom surface of the embossing layer.

In an embodiment, a side surface of the cushion layer may face a side surface of the flexible circuit substrate.

In an embodiment, the cushion layer and the flexible circuit substrate may be spaced from each other in a direction parallel to the rear surface, and the heat-dissipation sheet and the flexible circuit substrate may be spaced from each other in a direction parallel to the rear surface.

In an embodiment, the display device may further include a frame below the heat-dissipation sheet.

In an embodiment, the frame may have a flat surface.

In an embodiment, a region of the frame that overlaps the first region in a direction perpendicular to the rear surface may have a first thickness, and a region of the frame that overlaps the second region in a direction perpendicular to the rear surface may have a second thickness that is less than the first thickness.

In an embodiment, the frame and the flexible circuit substrate may be spaced from each other.

According to an embodiment of the inventive concept, a display device may include a display panel, a cushion layer below the display panel, and a flexible circuit substrate electrically connected to the display panel and bent toward a rear surface of the display panel. The cushion layer and the flexible circuit substrate may not overlap each other in a direction perpendicular to the rear surface.

In an embodiment, the display device may further include a window on the display panel, and a frame coupled with the window to contain the display panel, the cushion layer, and the flexible circuit substrate. In a direction perpendicular to the rear surface, a thickness of a portion of the frame that overlaps the flexible circuit substrate may be greater than a thickness of another portion of the frame that overlaps the cushion layer.

In an embodiment, the display device may further include an embossing layer between the display panel and the cushion layer.

In an embodiment, the flexible circuit substrate and the cushion layer may be attached to a bottom surface of the embossing layer.

In an embodiment, the display device may further include an electromagnetic shield between the embossing layer and the flexible circuit substrate.

In an embodiment, the cushion layer and the flexible circuit substrate may be spaced from each other in a direction parallel to the rear surface.

In an embodiment, the display device may further include a heat-dissipation sheet below the cushion layer. The heat-dissipation sheet may not overlap the flexible circuit substrate in a direction perpendicular to the rear surface.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
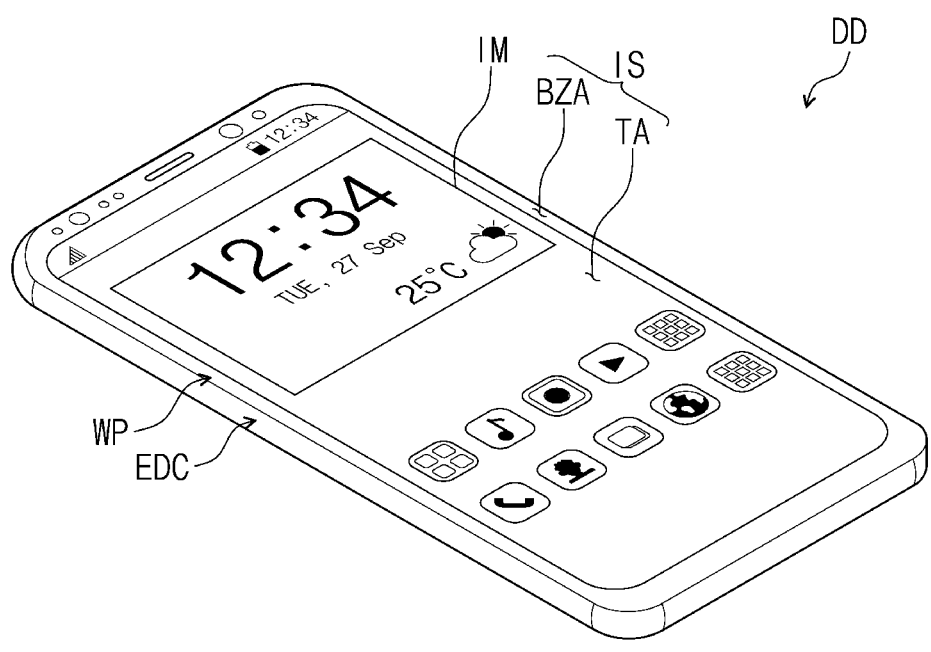
FIG. 1 is a perspective view illustrating a display device according to an embodiment of the inventive concept.

These figures are intended to illustrate the general characteristics of methods, structure and/or materials utilized in certain example embodiments and to supplement the written description provided below. These drawings may not, however, be to scale and may not precisely reflect the precise structural or performance characteristics of any given embodiment, and may not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances may be expected. Thus, example embodiments of the inventive concepts should not be construed as limited to the particular shapes of regions illustrated herein but are to include deviations in shapes that result, for example, from manufacturing.

Unless otherwise defined, all terms (e.g., including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

FIG. 1 is a perspective view illustrating a display device according to an embodiment of the inventive concept.

Referring to FIG. 1, a display device DD may be activated by an electrical signal. The display device DD may be used to realize various electronic devices. For example, the display device DD may be used for large-sized electronic devices (e.g., television sets, monitors, and outdoor billboards) or small or medium-sized electronic devices (e.g., personal computers, notebook computers, personal digital assistants, car navigation systems, game machines, portable electronic devices, and cameras). However, it should be understood that these are merely examples of the inventive concept, and that other electronic devices may be used to realize the inventive concept, unless they do not depart from the inventive concept. In the present embodiment, the display device DD may be a smart phone, as illustrated in FIG. 1.

The display device DD may display an image IM, which is displayed on a display surface IS parallel to a first direction DR1 and a second direction DR2 and is provided toward a third direction DR3. The display surface IS for displaying the image IM may correspond to a front surface of the display device DD and to a front surface of a window layer WP. Hereinafter, all of the display surface or front surface IS of the display device DD and the front surface of the window layer WP may be the same surface. The image IM may be a video image (e.g., a moving image) or a still image. As an example of the image IM, a clock window and icons are shown in FIG. 1.

In the present embodiment, a front or top surface and a rear or bottom surface of each element may be defined based on the display direction of the image IM. The front surface and the rear surface may be opposite to each other in the third direction DR3, and a direction normal to each of the front and rear surfaces may be parallel to the third direction DR3.

In the present specification, directions indicated by the first to third directions DR1, DR2, and DR3 may be relative concept, and in an embodiment, they may be used to indicate other directions. Hereinafter, first to third directions may be directions indicated by the first to third directions DR1, DR2, and DR3, respectively, and will be referenced with the same reference numbers. In the present specification, a surface defined by the first direction DR1 and the second direction DR2 may be referred to as a "plane", and an expression of "when viewed in a plan view" may mean that an object to be described there is seen from a direction perpendicular to the plane.

An external case EDC, along with the window layer WP, may define an exterior appearance of the display device DD. Although the external case EDC is illustrated as a single body, the external case EDC may include a plurality of bodies that are assembled with each other. For example, the external case EDC may include a plurality of frames and/or plates, each of which is formed of at least one of glass, plastic, or metallic materials.

The front surface of the display device DD may be divided into (e.g., may include) a transmission region TA and a bezel region BZA. The front surface of the display device DD may be substantially defined by a front surface IS of the window layer WP. The window layer WP may include the transmission region TA and the bezel region BZA. Hereinafter, the front surface of the display device DD and the front surface of the window layer WP may be denoted by the same reference character IS.

Figure 2:
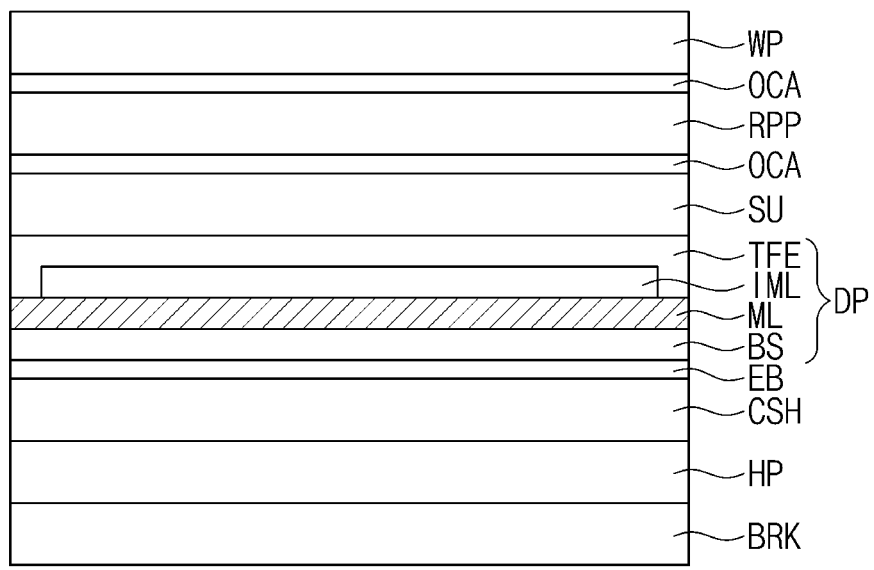
FIG. 2 is a schematic sectional view illustrating a display device according to an embodiment of the inventive concept.
Figure 2:

FIG. 2 is a schematic sectional view illustrating a display device according to an embodiment of the inventive concept.

Referring to FIG. 2, the display device DD may include an adhesive layer OCA, an anti-reflection layer RPP, an input sensing layer SU, a display panel DP, an embossing layer EB, a cushion layer CSH, a heat-dissipation sheet HP, and a frame BRK, in addition to the window layer WP.

The window layer WP may define an exterior appearance of the display device DD. The window layer WP may protect internal elements of the display device DD from an external impact and may be an element substantially providing the display surface IS of the display device DD. For example, the window layer WP may include a glass substrate, a sapphire substrate, and/or a plastic film. The window layer WP may have a single or multi-layered structure. For example, the window layer WP may have a stacking structure including a plurality of plastic films, which are coupled to each other by an adhesive layer, or may have a stacking structure including a glass substrate and a plastic film, which are coupled to each other by an adhesive layer.

The adhesive layer OCA (e.g., a first OCA) may be located below the window layer WP. The window layer WP and the anti-reflection layer RPP may be coupled or bonded to each other by the adhesive layer OCA. The adhesive layer OCA may include various adhesive or sticky materials. For example, the adhesive layer OCA may include an optically clear adhesive film, an optically clear resin, or a pressure sensitive adhesive film.

The anti-reflection layer RPP may be located below the window layer WP. The anti-reflection layer RPP may reduce reflectance of natural or solar light that is incident on the window layer WP from an outer space (e.g., an external source). In an embodiment, the anti-reflection layer RPP may include a phase retarder and a polarizer. The phase retarder may be of a film type or a liquid crystal coating type and may include a λ/2 and/or λ/4 phase retarder. The polarizer may be of a film type or a liquid crystal coating type. The polarizer of the film type may include an elongated synthetic resin film, whereas the polarizer of the liquid crystal coating type may include liquid crystals arranged in a specific orientation. The anti-reflection layer RPP may further include a protection film, in addition to the phase retarder and the polarizer. At least one of the phase retarder, the polarizer, or the protection films may be used as a base layer of the anti-reflection layer RPP.

The adhesive layer OCA (e.g., a second OCA) may be located below the anti-reflection layer RPP. The anti-reflection layer RPP and the input sensing layer SU may be coupled or bonded to each other by the adhesive layer OCA.

The input sensing layer SU may obtain coordinate information on an external input. In an embodiment, the input sensing layer SU may be directly located on a surface of the display panel DP. For example, the input sensing layer SU may be integrated on the display panel DP in an on-cell manner. The input sensing layer SU may be a part of the display panel DP and may be fabricated during a process of fabricating the display panel DP. However, the inventive concept is not limited to this example, and in an embodiment, the input sensing layer SU may be fabricated by a separate process and may be attached to the display panel DP. The input sensing layer SU may include a touch panel.

The display panel DP may be located below the input sensing layer SU. The display panel DP may be a light-receiving type display panel or a light-emitting type display panel. The light-receiving type display panel may be, for example, a liquid crystal display panel. The light-emitting type display panel may be, for example, an organic light emitting display panel or a quantum dot light-emitting display panel. A light emitting layer of the organic light emitting display panel may include an organic light emitting material. A light emitting layer of the quantum dot light-emitting display panel may include quantum dots and/or quantum rods. The description that follows refers to an example in which the display panel DP is the organic light emitting display panel. The display panel DP may include a base layer BS, a circuit element layer ML, a display element layer IML, and a thin encapsulation layer TFE.

The embossing layer EB may be located below the display panel DP. The embossing layer EB may have a specific color. For example, the embossing layer EB may be black. The embossing layer EB may absorb light to be incident thereto. The embossing layer EB may have a layer whose opposite surfaces have an adhesive property. The embossing layer EB may be formed of or may include one or more of various suitable adhesive and/or sticky materials. The display panel DP and the cushion layer CSH may be coupled or bonded to each other by the embossing layer EB.

The cushion layer CSH may be located below the embossing layer EB. The cushion layer CSH may have a function of reducing pressure exerted from the frame BRK. The cushion layer CSH may be formed of or may include a sponge, a blown foam, a urethane resin, and/or any other suitable material. The cushion layer CSH may be thicker than the embossing layer EB.

The heat-dissipation sheet HP may be located below the cushion layer CSH. The heat-dissipation sheet HP may block a noise, which is generated from the display panel DP, and may contribute to exhaust heat from the display panel DP. For example, the heat-dissipation sheet HP may be a copper (Cu) sheet. However, the inventive concept is not limited to this example, and the heat-dissipation sheet HP may include one or more of various suitable layers. For example, the heat-dissipation sheet HP may be a graphite sheet. In an embodiment, the stacking order of the cushion layer CSH and the heat-dissipation sheet HP may be changed.

The frame BRK may be located below the heat-dissipation sheet HP. The frame BRK may contain the adhesive layer OCA, the anti-reflection layer RPP, the input sensing layer SU, the display panel DP, the embossing layer EB, the cushion layer CSH, and the heat-dissipation sheet HP. The frame BRK may provide a space for containing other components or elements. The frame BRK may include a metallic or plastic member. Although one frame BRK is exemplarily illustrated in FIG. 2, the display device DD may include a plurality of the frames BRK.

Figure 3:
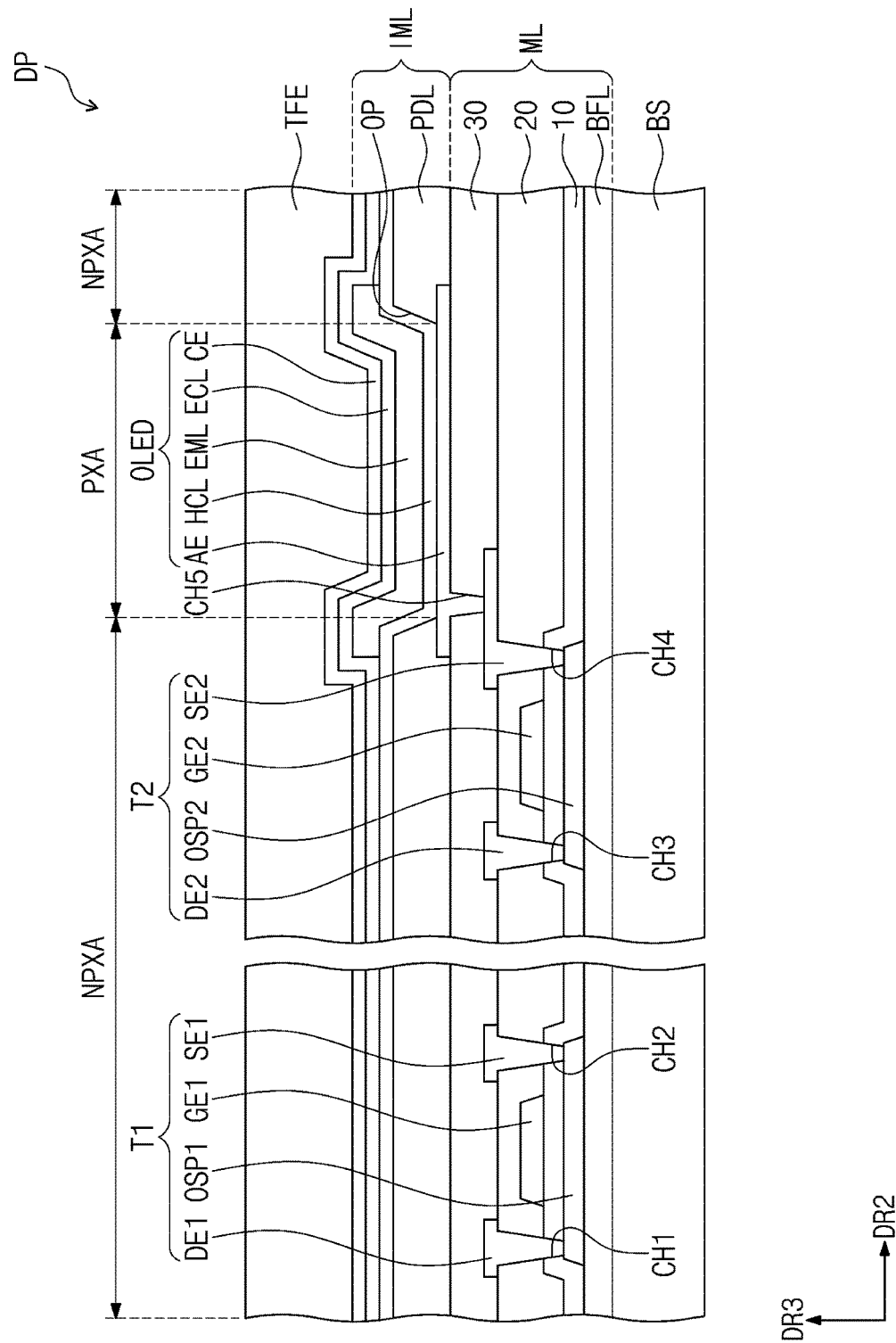
FIG. 3 is a sectional view illustrating a display panel according to an embodiment of the inventive concept.

FIG. 3 is a sectional view illustrating a display panel (e.g., DP) according to an embodiment of the inventive concept.

Referring to FIG. 3, the circuit element layer ML, the display element layer IML, and the thin encapsulation layer TFE may be sequentially arranged on the base layer BS.

The base layer BS may include a synthetic resin layer. The synthetic resin layer may be formed or positioned on a working substrate, which is used to fabricate the display panel DP. Thereafter, a conductive layer, an insulating layer, and so forth may be formed or positioned on the synthetic resin layer. If the working substrate is removed, the synthetic resin layer may be used as the base layer BS. The synthetic resin layer may include at least one of thermoset resins. The synthetic resin layer may be a polyimide-based resin layer, and the inventive concept is not limited to a specific material of the base layer BS. In addition, the base layer BS may include a glass substrate, a metal substrate, and/or an organic/inorganic composite substrate.

In the present embodiment, the circuit element layer ML may include a buffer layer BFL, a first intermediate inorganic layer 10, and a second intermediate inorganic layer 20, which are inorganic layers, and an intermediate organic layer 30, which is an organic layer. The inventive concept is not limited to the particular materials of the inorganic and organic layers, and the buffer layer BFL may be optional, depending on a structure of the circuit element layer ML.

A first semiconductor pattern OSP1 of a first transistor T1 and a second semiconductor pattern OSP2 of a second transistor T2 may be on the buffer layer BFL. The first semiconductor pattern OSP1 and the second semiconductor pattern OSP2 may be formed of or may include at least one of amorphous silicon, poly silicon, or metal oxide semiconductor materials.

The first intermediate inorganic layer 10 may be on the first semiconductor pattern OSP1 and the second semiconductor pattern OSP2. A first control electrode GE1 of the first transistor T1 and a second control electrode GE2 of the second transistor T2 may be on the first intermediate inorganic layer 10.

The second intermediate inorganic layer 20 may be on the first intermediate inorganic layer 10 to cover the first control electrode GE1 and the second control electrode GE2. A first input electrode DE1 and a first output electrode SE1 of the first transistor T1 and a second input electrode DE2 and a second output electrode SE2 of the second transistor T2 may be on the second intermediate inorganic layer 20.

The first input electrode DE1 and the first output electrode SE1 may be respectively connected to two different portions of the first semiconductor pattern OSP1 through a first penetration hole CH1 and a second penetration hole CH2. The first penetration hole CH1 and the second penetration hole CH2 penetrate the first intermediate inorganic layer 10 and the second intermediate inorganic layer 20. The second input electrode DE2 and the second output electrode SE2 may be respectively connected to two different portions of the second semiconductor pattern OSP2 through a third penetration hole CH3 and a fourth penetration hole CH4. The third penetration hole CH3 and the fourth penetration hole CH4 penetrate the first intermediate inorganic layer 10 and the second intermediate inorganic layer 20. In an embodiment, at least one of the first transistor T1 and the second transistor T2 may have a bottom gate structure.

The intermediate organic layer 30 may be on the second intermediate inorganic layer 20 to cover the first input electrode DE1, the second input electrode DE2, the first output electrode SE1, and the second output electrode SE2. The intermediate organic layer 30 may provide a flat surface.

The display element layer IML may be on the intermediate organic layer 30. The display element layer IML may include a pixel definition layer PDL and an organic light emitting diode OLED. The pixel definition layer PDL may be formed of or may include an organic material. A first electrode AE may be on the intermediate organic layer 30. The first electrode AE may be connected to the second output electrode SE2 through a fifth penetration hole CH5 penetrating the intermediate organic layer 30. An opening OP may be defined in the pixel definition layer PDL. The opening OP of the pixel definition layer PDL may expose at least a portion of the first electrode AE. In an embodiment, the pixel definition layer PDL may be optional.

In an embodiment, a light-emitting region PXA may overlap at least one of the first and second transistors T1 and T2. The opening OP may be provided to have an increased width, and each of the first electrode AE and a light emitting layer EML may be provided to have an increased width.

A hole control layer HCL may be located in both of the light-emitting region PXA and a non-light-emitting region NPXA. The light emitting layer EML may be on the hole control layer HCL. The light emitting layer EML may be on a region corresponding to the opening OP. The light emitting layer EML may be formed of or may include an organic material and/or an inorganic material. The light emitting layer EML may generate light of a specific color.

An electron control layer ECL may be on the light emitting layer EML. A second electrode CE may be on the electron control layer ECL.

The thin encapsulation layer TFE may be on the second electrode CE. The thin encapsulation layer TFE may cover the second electrode CE. A capping layer may be further located between the thin encapsulation layer TFE and the second electrode CE to cover the second electrode CE. Here, the thin encapsulation layer TFE may directly cover the capping layer.

Figure 4:
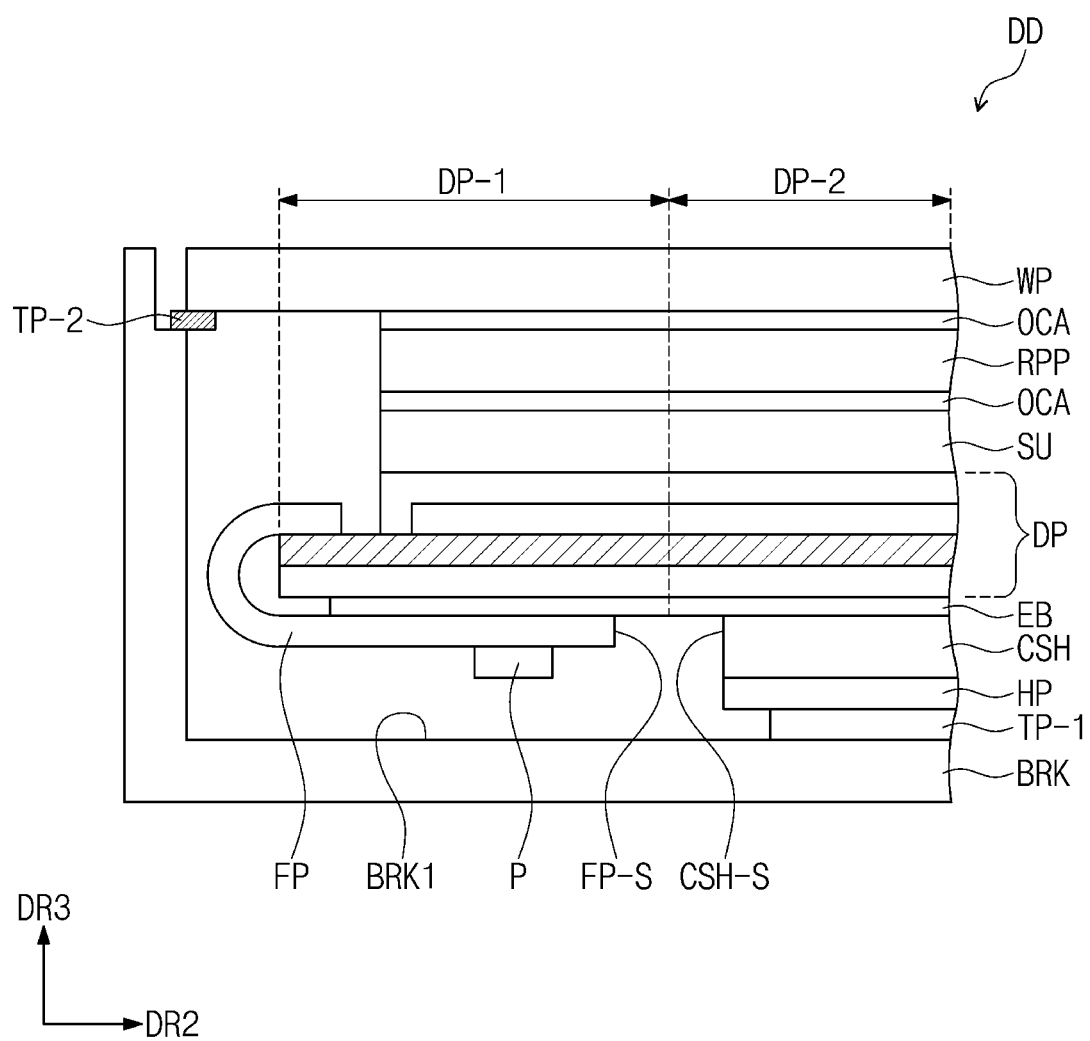
FIG. 4 is a sectional view illustrating a display device according to an embodiment of the inventive concept.
Figure 5:
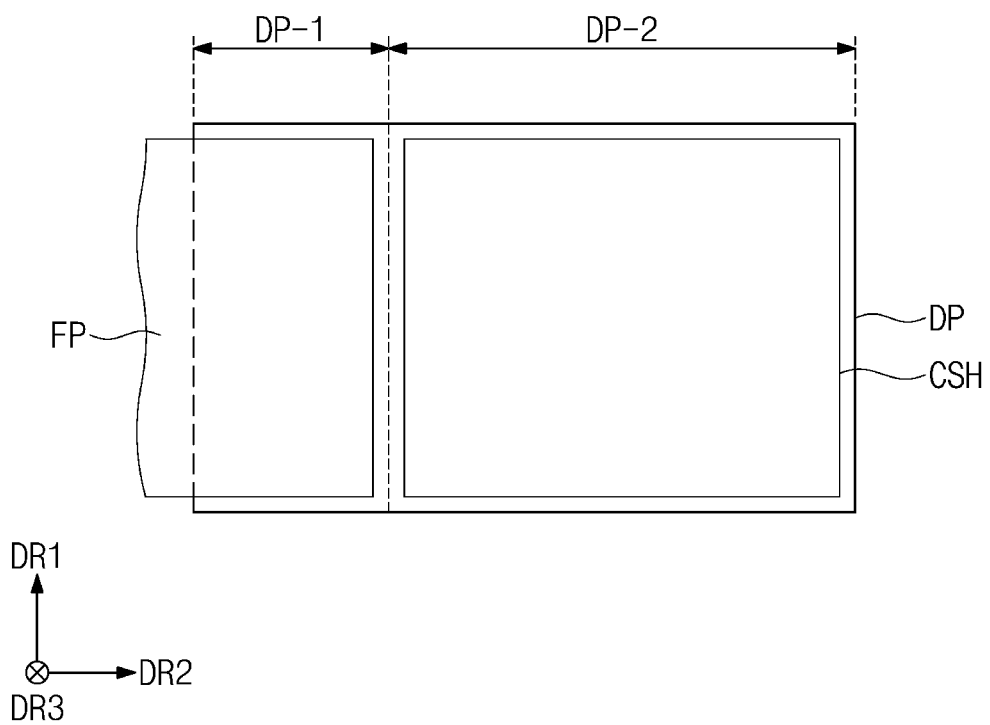
FIG. 5 is a rear view of a display device exemplarily illustrating some elements of the display device according to an embodiment of the inventive concept.

FIG. 4 is a sectional view illustrating a display device according to an embodiment of the inventive concept, and FIG. 5 is a rear view of a display device exemplarily illustrating some elements of the display device according to an embodiment of the inventive concept. In order to reduce complexity in the drawings and to provide better understanding of the inventive concept, only the display panel DP, the cushion layer CSH, and a flexible circuit substrate FP are illustrated in FIG. 5.

Referring to FIGS. 4 and 5, the display device DD may include the window layer WP, the adhesive layer OCA, the anti-reflection layer RPP, the input sensing layer SU, the display panel DP, the embossing layer EB, the flexible circuit substrate FP, the cushion layer CSH, the heat-dissipation sheet HP, and the frame BRK.

The anti-reflection layer RPP may be located below the window layer WP. The window layer WP and the anti-reflection layer RPP may be coupled or bonded to each other by the adhesive layer OCA. In an embodiment, the anti-reflection layer RPP may be optional. The input sensing layer SU may be located below the anti-reflection layer RPP. The anti-reflection layer RPP and the input sensing layer SU may be coupled or bonded to each other by the adhesive layer OCA. The display panel DP may be located below the input sensing layer SU. The display panel DP may include an organic light emitting display panel. The display panel DP may include a first region DP-1 and a second region DP-2 adjacent to the first region DP-1. The first region DP-1 may overlap the flexible circuit substrate FP in a direction perpendicular to the rear surface. The second region DP-2 may overlap the cushion layer CSH in a direction perpendicular to the rear surface.

The embossing layer EB may be located below the display panel DP. The embossing layer EB may overlap the first region DP-1 and the second region DP-2 in a direction perpendicular to the rear surface. The embossing layer EB may have two opposite surfaces having an adhesive property.

The flexible circuit substrate FP may be connected to the display panel DP. For example, the flexible circuit substrate FP may be electrically connected to the circuit element layer ML (e.g., see FIG. 2) of the display panel DP. The flexible circuit substrate FP may be bent toward the rear surface of the display panel DP and may include a portion located below the embossing layer EB. The flexible circuit substrate FP and the rear surface of the display panel DP may be coupled or bonded to each other by the embossing layer EB. The flexible circuit substrate FP may overlap the first region DP-1 in a direction perpendicular to the rear surface.

A driving device P may be located below the flexible circuit substrate FP. The driving device P may output image signals and driving signals, which are needed to display an image. The driving device P may be electrically connected to conductive patterns, which are located in a region of the flexible circuit substrate FP. The image signals and the driving signals, which are output signals from the driving device P, may be transferred to the display panel DP through the flexible circuit substrate FP. FIG. 4 illustrates an example in which one driving device P is located on the flexible circuit substrate FP, but the inventive concept is not limited to this example. In an embodiment, a plurality of driving devices, which are needed to display an image, may be on the flexible circuit substrate FP.

The cushion layer CSH may be located below the embossing layer EB. The heat-dissipation sheet HP may be located below the cushion layer CSH. The cushion layer CSH and the heat-dissipation sheet HP may overlap only the second region DP-2 in a direction perpendicular to the rear surface. In other words, the cushion layer CSH and the heat-dissipation sheet HP may not overlap the first region DP-1 in a direction perpendicular to the rear surface.

The flexible circuit substrate FP and the cushion layer CSH may not overlap each other in a direction perpendicular to the rear surface. The flexible circuit substrate FP and the cushion layer CSH may be located below the embossing layer EB. The flexible circuit substrate FP and the heat-dissipation sheet HP may not overlap each other in a direction perpendicular to the rear surface. A side surface FP-S of the flexible circuit substrate FP may face a side surface CSH-S of the cushion layer CSH. The flexible circuit substrate FP and the cushion layer CSH may be spaced from each other in the second direction DR2. The flexible circuit substrate FP and the heat-dissipation sheet HP may be spaced from each other in the second direction DR2.

The frame BRK may be located below the heat-dissipation sheet HP. The frame BRK and the heat-dissipation sheet HP may be coupled to each other by a first adhesive tape TP-1. However, the inventive concept is not limited to this example, and in an embodiment, the first adhesive tape TP-1 may be optional.

In addition, the frame BRK may be coupled to the window layer WP to contain the adhesive layer OCA, the anti-reflection layer RPP, the input sensing layer SU, the display panel DP, the embossing layer EB, the flexible circuit substrate FP, the cushion layer CSH, and the heat-dissipation sheet HP. The frame BRK and the window layer WP may be coupled to each other by a second adhesive tape TP-2. The frame BRK may be spaced from the flexible circuit substrate FP and the driving device P in the third direction DR3.

According to an embodiment of the inventive concept, the frame BRK may include a flat surface BRK1. The heat-dissipation sheet HP and the cushion layer CSH may not be located between the display panel DP and the flexible circuit substrate FP, and thus, a thickness of the display device DD may be reduced. Accordingly, to reduce a thickness of the display device DD, the frame BRK may not provide an opening or container region for containing the driving device P. Because the frame BRK has a uniform thickness, it may be possible to improve durability of the display device DD.

Figure 6:
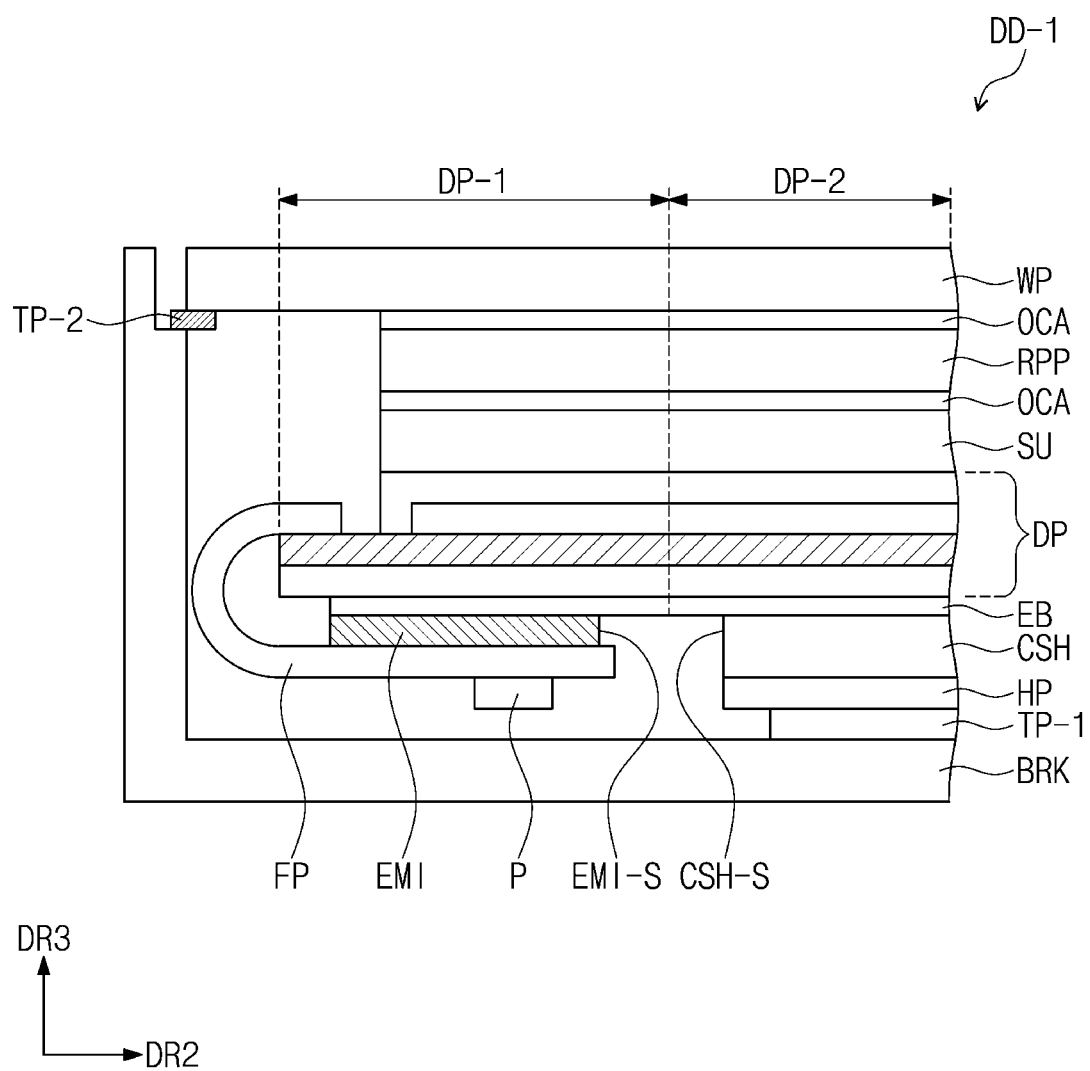
FIG. 6 is a sectional view illustrating a display device according to an embodiment of the inventive concept.

FIG. 6 is a sectional view illustrating a display device according to an embodiment of the inventive concept. An element previously described with reference to FIGS. 4 and 5 may be identified by the same reference number without repeating an overlapping description thereof.

Referring to FIG. 6, a display device DD-1 may further include an electromagnetic shield EMI. The electromagnetic shield EMI may be located below the embossing layer EB. The display panel DP and the electromagnetic shield EMI may be coupled or bonded to each other by the embossing layer EB. The electromagnetic shield EMI may overlap the first region DP-1 in a direction perpendicular to the rear surface.

The flexible circuit substrate FP may be electrically connected to the display panel DP and may be bent toward the rear surface of the display panel DP to include a portion located below the electromagnetic shield EMI. A side surface EMI-S of the electromagnetic shield EMI may face the side surface CSH-S of the cushion layer CSH. The electromagnetic shield EMI may not overlap the cushion layer CSH in a direction perpendicular to the rear surface. The electromagnetic shield EMI may not overlap the heat-dissipation sheet HP in a direction perpendicular to the rear surface.

Figure 7:
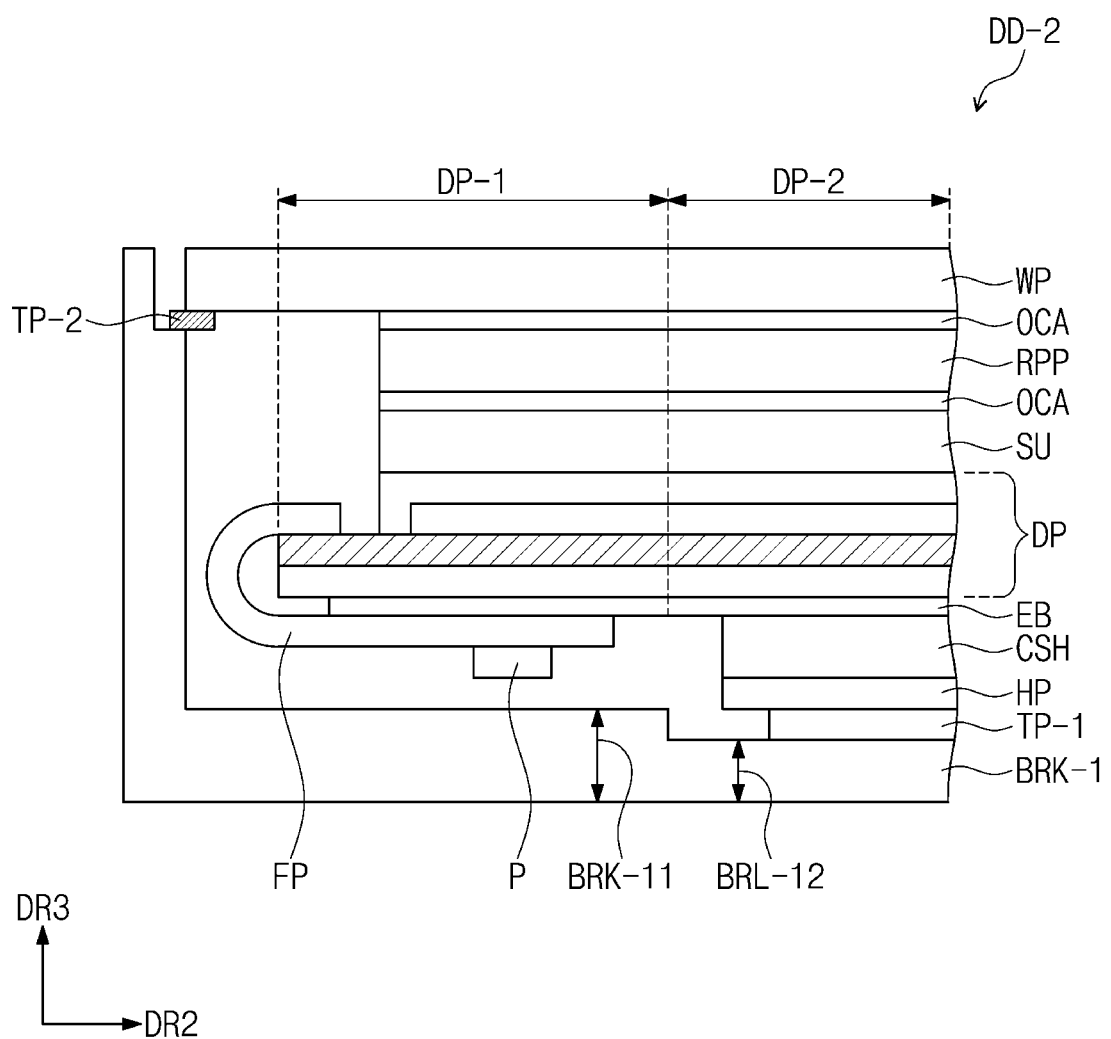
FIG. 7 is a sectional view illustrating a display device according to an embodiment of the inventive concept.

FIG. 7 is a sectional view illustrating a display device according to an embodiment of the inventive concept. An element previously described with reference to FIGS. 4 and 6 may be identified by the same reference number without repeating an overlapping description thereof.

Referring to FIG. 7, a display device DD-2 may include the window layer WP, the adhesive layer OCA, the anti-reflection layer RPP, the input sensing layer SU, the display panel DP, the embossing layer EB, the flexible circuit substrate FP, the cushion layer CSH, the heat-dissipation sheet HP, and a frame BRK-1. The frame BRK-1 may include at least one portion having a stepwise section. The frame BRK-1, which overlaps the first region DP-1, may have a first thickness BRK-11. The frame BRK-1 overlaps the second region DP-2 and may have a second thickness BRL-12. The first thickness BRK-11 may be greater than the second thickness BRL-12. The frame BRK-1 may be spaced from the flexible circuit substrate FP and the driving device P in the third direction DR3.

According to an embodiment of the inventive concept, the heat-dissipation sheet HP and the cushion layer CSH may not be located between the display panel DP and the flexible circuit substrate FP, and thus, a thickness of the display device DD may be reduced. A thickness of a portion of the frame BRK may be increased. Because of such an increase in the thickness of the frame BRK, it may be possible to increase a rigidity or a mechanical strength of the frame BRK. Thus, the display device DD with improved durability may be provided.

According to an embodiment of the inventive concept, a display device may include a display panel, a cushion layer located below the display panel, and a flexible circuit substrate, which is electrically connected to the display panel and is bent toward a rear surface of the display panel. The flexible circuit substrate may not overlap the cushion layer in a direction perpendicular to the rear surface. Thus, the cushion layer may not be located between the flexible circuit substrate and the display panel, and thus, the thickness of the display device may be reduced.

While example embodiments of the inventive concepts have been particularly shown and described, it will be understood by one of ordinary skill in the art that variations in form and detail may be made therein without departing from the spirit and scope of the attached claims, and their equivalents.

What is claimed is:

1. A display device comprising:
   a display panel;
   a cushion layer below the display panel;
   a heat-dissipation sheet below the cushion layer; and
   a flexible circuit substrate electrically connected to the display panel and bent toward a rear surface of the display panel,
   wherein the display panel comprises a first region that overlaps the flexible circuit substrate and a second region that overlaps the cushion layer in a direction perpendicular to the rear surface, and
   wherein the cushion layer and the heat-dissipation sheet only overlap the second region in the direction perpendicular to the rear surface.

2. The display device of claim 1, further comprising an embossing layer between the display panel and the cushion layer,
   wherein the embossing layer overlaps the first region and the second region in the direction perpendicular to the rear surface.

3. The display device of claim 2, wherein the embossing layer has two opposite surfaces, each of the opposite surfaces having an adhesive property.

4. The display device of claim 2, wherein the flexible circuit substrate and the cushion layer are attached to a bottom surface of the embossing layer.

5. The display device of claim 2, further comprising an electromagnetic shield between the embossing layer and the flexible circuit substrate.

6. The display device of claim 5, wherein a side surface of the electromagnetic shield faces a side surface of the cushion layer.

7. The display device of claim 5, wherein the flexible circuit substrate and the electromagnetic shield are attached to a bottom surface of the embossing layer.

8. The display device of claim 1, wherein a side surface of the cushion layer faces a side surface of the flexible circuit substrate.

9. The display device of claim 1, wherein, in a direction parallel to the rear surface, the cushion layer and the flexible circuit substrate are spaced from each other, and the heat-dissipation sheet and the flexible circuit substrate are spaced from each other.

10. The display device of claim 1, further comprising a frame below the heat-dissipation sheet.

11. The display device of claim 10, wherein the frame has a flat surface.

12. The display device of claim 10, wherein a region of the frame that overlaps the first region in the direction perpendicular to the rear surface has a first thickness, and
    a region of the frame that overlaps the second region in the direction perpendicular to the rear surface has a second thickness smaller than the first thickness.

13. The display device of claim 10, wherein the frame and the flexible circuit substrate are spaced from each other.

14. A display device comprising:
    a display panel;
    a cushion layer below the display panel;
    a flexible circuit substrate electrically connected to the display panel and bent toward a rear surface of the display panel; and
    a heat-dissipation sheet below the cushion layer,
    wherein the heat-dissipation sheet does not overlap the flexible circuit substrate in a direction perpendicular to the rear surface, and
    wherein the cushion layer and the flexible circuit substrate do not overlap each other in the direction perpendicular to the rear surface.

15. The display device of claim 14, further comprising an embossing layer between the display panel and the cushion layer.

16. The display device of claim 15, wherein the flexible circuit substrate and the cushion layer are attached to a bottom surface of the embossing layer.

17. The display device of claim 15, further comprising an electromagnetic shield located between the embossing layer and the flexible circuit substrate.

18. The display device of claim 14, wherein the cushion layer and the flexible circuit substrate are spaced from each other in a direction parallel to the rear surface.

19. A display device comprising:
  a display panel;
  a cushion layer below the display panel;
  a flexible circuit substrate electrically connected to the display panel and bent toward a rear surface of the display panel;
  a window on the display panel; and
  a frame coupled with the window to contain the display panel, the cushion layer, and the flexible circuit substrate,
  wherein the cushion layer and the flexible circuit substrate do not overlap each other in a direction perpendicular to the rear surface, and
  wherein, in the direction perpendicular to the rear surface, a thickness of a portion of the frame that overlaps the flexible circuit substrate is greater than a thickness of another portion of the frame that overlaps the cushion layer.

* * * * *